US007923808B2

(12) United States Patent
Ding et al.

(10) Patent No.: US 7,923,808 B2
(45) Date of Patent: Apr. 12, 2011

(54) STRUCTURE OF VERY HIGH INSERTION LOSS OF THE SUBSTRATE NOISE DECOUPLING

(75) Inventors: Hanyi Ding, Essex Jct., VT (US); Kai D. Feng, Hopewell Junction, NY (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 573 days.

(21) Appl. No.: 11/942,811

(22) Filed: Nov. 20, 2007

(65) Prior Publication Data

US 2009/0127652 A1 May 21, 2009

(51) Int. Cl.
*H01L 21/20* (2006.01)
*H01L 21/36* (2006.01)

(52) U.S. Cl. .................. 257/508; 257/712; 257/E21.54; 257/E23.114; 438/122; 438/404; 438/215

(58) Field of Classification Search .................. 438/122, 438/404, 215, 458, 348, 361; 257/508, 712, 257/E21.54, E23.114, E23.082, E21.506
See application file for complete search history.

(56) References Cited

U.S. PATENT DOCUMENTS

| | | | | |
|---|---|---|---|---|
| 5,442,228 | A | 8/1995 | Pham et al. | |
| 6,300,223 | B1 | 10/2001 | Chang et al. | |
| 6,412,786 | B1 | 7/2002 | Pan | |
| 6,492,716 | B1 | 12/2002 | Bothra et al. | |
| 6,586,292 | B2 | 7/2003 | Wu et al. | |
| 6,737,740 | B2 | 5/2004 | Forbes et al. | |
| 6,879,023 | B1 | 4/2005 | Gutierrez | |
| 7,087,496 | B2 | 8/2006 | Gutierrez | |
| 7,098,073 | B1 | 8/2006 | Mangrum | |
| 7,196,427 | B2 | 3/2007 | Mangrum | |
| 2005/0110118 | A1 | 5/2005 | Udupa et al. | |
| 2006/0163688 | A1 * | 7/2006 | Ding et al. | 257/508 |

* cited by examiner

*Primary Examiner* — Cuong Q Nguyen
*Assistant Examiner* — Cathy N Lam
(74) *Attorney, Agent, or Firm* — Anthony Canale; Roberts Mlotkowski Safran & Cole, P.C.

(57) ABSTRACT

A structure includes a substrate comprising a region having a circuit or device which is sensitive to electrical noise. Additionally, the structure includes a first isolation structure extending through an entire thickness of the substrate and surrounding the region and a second isolation structure extending through the entire thickness of the substrate and surrounding the region.

13 Claims, 17 Drawing Sheets

100
80
30
15
30
80
10
90

80
30
10
15
120

STRUCTURE OF VERY HIGH INSERTION LOSS OF THE SUBSTRATE NOISE DECOUPLING

FIELD OF THE INVENTION

The present invention relates to a structure and method using dual through-wafer vias for substrate to device/circuit coupling noise reduction or increased insertion loss, and the design structure on which the subject circuit structure resides.

BACKGROUND OF THE INVENTION

In an integrated circuit, a signal can couple from one node to another via the substrate. This phenomenon is referred to as substrate coupling or substrate noise coupling. Moreover, a substrate that is susceptible to substrate noise coupling may be described as having a low insertion loss, where insertion loss is a decrease in transmitted signal. Substrate noise coupling remains one of the main concerns in low noise circuits for mixed signal and system-on-chip (SOC) designs.

The push for reduced cost, more compact integrated circuit systems, and added customer features has provided incentives for the inclusion of analog functions on primarily digital integrated circuits (ICs) forming mixed-signal ICs. In these systems, the speed of digital circuits is constantly increasing, chips are becoming more densely packed, interconnect layers are added, and analog resolution is increased. In addition, recent increases in wireless applications and its growing market are introducing a new set of aggressive design goals for realizing mixed-signal systems.

However, in mixed-signal systems, both sensitive analog circuits and high-swing, high-frequency noise injector digital circuits may be present on the same chip, leading to undesired signal coupling between these two types of circuits via the conductive substrate. Additionally, the reduced distance between these circuits, which is the result of constant technology scaling, exacerbates the noise coupling.

A challenging task, applicable to any mixed-signal IC, is to minimize noise coupling between various parts of the system to avoid any malfunctioning of the system. In other words, for successful system-on-chip integration of mixed-signal systems, the noise coupling caused by non-ideal isolation should be minimized so that sensitive analog circuits and noisy digital circuits can effectively coexist, and the system operates correctly.

The primary mixed-signal noise coupling problem comes from fast-changing digital signals coupling to sensitive analog nodes. Another significant cause of undesired signal coupling is the cross-talk between analog nodes themselves owing to high-frequency/high-power analog signals. One of the media through which mixed-signal noise coupling occurs is the substrate. Digital operations cause fluctuations in the underlying substrate voltage, which spreads through the common substrate causing variations in the substrate potential of sensitive devices in the analog section. Similarly, in the case of cross talk between analog nodes, a signal can couple from one node to another via the substrate.

Additionally, substrate noise coupling is a concern with low noise amplifiers (LNAs). A LNA is a special type of electronic amplifier or amplifier used in communications systems to amplify very weak signals captured by an antenna, e.g., of a radio frequency telescope. The LNA may be located close to the antenna, such that the losses in the signal path become less critical. Using a LNA, the noise of all subsequent stages is reduced by the gain of the LNA and the noise of the LNA is injected directly into the received signal. Thus, it is desirable for a LNA to boost the desired signal power while adding as little noise and distortion as possible so that the retrieval of this signal is possible in the later stages in the system.

Furthermore, substrate noise coupling is a concern with phase-locked loop (PLL) systems. A PLL is an electronic control system that generates a signal that is locked to the phase of an input or "reference" signal. This circuit compares the phase of a controlled oscillator to the reference, automatically raising or lowering the frequency of the oscillator until its phase (and therefore frequency) is matched to that of the reference. Phase-lock loops are widely used in radio, telecommunications, computers and other electronic applications to generate stable frequencies, or to recover a signal from a noisy communication channel. Since a single integrated circuit can provide a complete phase-lock-loop building block, the technique is widely used in modern electronic devices, with output frequencies from a fraction of a cycle per second up to many gigahertz. However, because the PLL is formed on a single integrated circuit, the device is susceptible to substrate noise coupling. For example, in a cellular phone transceiver, when the pre-driver operates, the PLL output becomes very noisy due to coupling with the substrate.

Conventionally, in attempting to minimize substrate noise coupling, designers have used deep and shallow trench isolations, guard ring structures and high doping layer/triple well structures. However, each of these noise isolation techniques suffer from drawbacks.

For example, deep and shallow trench isolations are too shallow and have no bottom, and thus cannot completely isolate substrate noise or eliminate substrate noise coupling. More specifically, deep trench isolations are typically 3 to 10 microns in depth and shallow trench isolations are typically 0.3 to 2 microns in depth. However, the depth of a substrate in which these deep or shallow trench isolations may be formed is typically at least 250 microns. Thus, noise has enough path in the substrate to bypass the deep and/or shallow trench isolations.

Moreover, guardrings, which are a type of trench isolation, are typically made of metal and formed by lithography and etch processing. However, these techniques may have the low insertion loss at high frequencies due to the parasitic capacitance and the shallow depth, which may render the device unsuitable for high frequency operations.

Accordingly, there exists a need in the art to overcome the deficiencies and limitations described hereinabove.

SUMMARY OF THE INVENTION

In a first aspect of the invention, a structure comprises a substrate comprising a region having a circuit or device which is sensitive to electrical noise. Additionally, the structure comprises a first isolation structure extending through an entire thickness of the substrate and surrounding the region and a second isolation structure extending through the entire thickness of the substrate and surrounding the region.

In an additional aspect of the invention, a method comprises forming at least one via filled with a dielectric and at least one via filled with metal in a substrate. Additionally, the method comprises removing a surface portion of the substrate to expose at least the metal and forming a metal layer in contact with at least the exposed metal to provide an electrical noise isolation area on the substrate.

In a further aspect of the invention, a design structure is embodied in a machine readable medium for designing, manufacturing, or testing a design, wherein the design structure comprises a substrate comprising a region having a circuit or device which is sensitive to electrical noise. Additionally, the design structure comprises a first isolation structure extending through an entire thickness of the substrate and surrounding the region and a second isolation structure extending through the entire thickness of the substrate and surrounding the region.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention relates to a structure and method using dual through-wafer vias (TWVs) for substrate to device/circuit coupling noise reduction or increased insertion loss, and the design structure on which the subject circuit structure resides. According to an aspect of the invention, an isolation structure comprises both low impedance and high impedance structures. More specifically, the isolation structure comprises a very low impedance grounded metal through-wafer via structure, a high impedance dielectric (e.g., silicon dioxide ($SiO_2$)) through-wafer via structure, and a surface (e.g., a bottom surface) structure. Thus, according to an embodiment of the invention, an isolation structure comprises a substrate having at least one metal through-wafer via (or a through-wafer via filled with metal), at least one dielectric (e.g., $SiO_2$) through-wafer via (or a through-wafer via filled with a dielectric), and a metal layer formed on a surface (e.g., a bottom surface) of the substrate connecting with at least the metal through-wafer via. Moreover, in embodiments the isolation structure provides, within the innermost through-wafer via structure, a protection area having a high insertion loss and low noise coupling.

By using a combination of both low impedance structures (metal through-wafer via) and high impedance structures ($SiO_2$ through-wafer via), the isolation structure provides isolation over an entire range of impedances. This may be thought of as analogous to providing a low pass filter and a high pass filter to effectively cover an entire range of frequencies. Additionally, by providing the grounded metal layer connected to the four walls of the metal through-wafer vias, an enclosed or substantially enclosed structure is provided. Moreover, by using metal as the outermost layer, where the conductivity of the metal is very high, the insertion loss within the protection area of the structure can be very high and the susceptibility to substrate noise coupling may be very low.

By implementing the invention, substrate noise coupling is reduced and noise isolation increased. Additionally, by providing the structure having TWVs formed through the depth of the substrate, the noise bypass path is eliminated. Moreover, the metal TWVs have no parasitic associated with them, so that the insertion loss has good high frequency performance. Additionally, by providing the through-wafer vias in multiple turns, further noise isolation, higher insertion loss, and lower substrate noise coupling may be achieved. Additionally, by implementing aspects of the invention, the whole structure can be scalable.

Structure Formation Process

Figure 1:
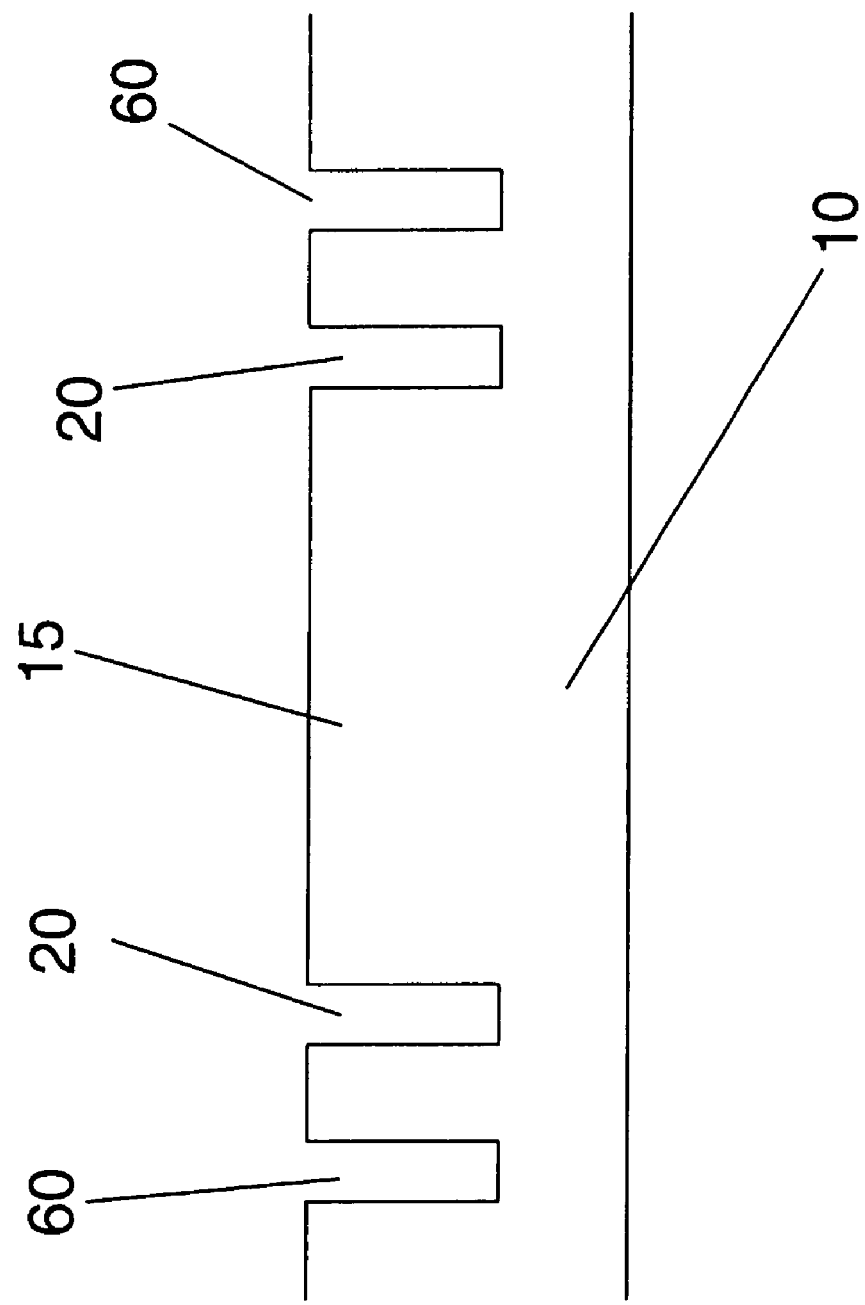
FIGS. 1-9 show process steps for forming a final structure shown in FIG. 10 in accordance with an aspect of the invention.

FIG. 1 shows a sectional side view of a beginning structure in accordance with the invention. The beginning structure comprises a substrate 10 having inner vias 20 and outer vias 60 etched therein. In embodiments, the substrate 10 may be, for example, a silicon substrate or a silicon-on-insulation (SOI) substrate. Moreover, the substrate 10 may be approximately 700-800 microns in thickness, with other thicknesses contemplated by the invention. The inner vias 20 and outer vias 60 may be formed according to a conventional via formation process, e.g., a lithography and etching process (e.g., a reactive ion etch (RIE)). As such, a description of the lithography and etch process is not necessary for a person of ordinary skill in the art to practice this particular step.

Additionally, while the inner vias 20 and the outer vias 60 are shown in FIG. 1 as discrete elements, it should be understood that the vias may be formed in a ring structure such that the outer vias 60 are actually a single via in a ring formation, and the inner vias 20 are a single via in a ring formation. Moreover, the inner vias 20 define a protection area 15 on the substrate 10, on which a device or a circuit (not shown) may be formed. In embodiments, the device or the circuit may be formed in the protection area 15 prior to formation of the inner vias 20 and outer vias 60.

Moreover, the inner vias 20 and outer vias 60 may be about 50-250 microns in depth, with other depths contemplated by the invention. Additionally, it should be understood that, while inner vias 20 and outer vias 60 are shown as etched to a depth through a portion of the thickness of the substrate 10, the vias 20, 60 may be etched completely through the entire thickness of the substrate 10.

Furthermore, the inner and outer vias 20, 60 may be about 50 microns long and about 3μ wide. As described further below, some of the vias may be filled with a dielectric (e.g., $SiO_2$) and the other vias may be filled with a metal. Wider vias (and the material that will fill the vias, as described further below) may allow for better noise isolation. The vias that will contain the metal may have a smaller width than the vias that will contain the $SiO_2$. Moreover, as wider vias will consume more device space, the width of the vias 20, 60 may be designed based on balancing process versus performance.

Additionally, the adjacent inner via 20 and outer via 60 on each side of the protection area 15 may be spaced from one another at a minimum of several microns (pitch may be about 9μ). Moreover, the adjacent inner via 20 and outer via 60 on each side of the protection area 15 may be spaced from one another at a distance greater than the minimum distance. However, in embodiments, the distance between the adjacent inner via 20 and outer via 60 may be designed as small as possible to reduce the overall structure size.

Figure 2:
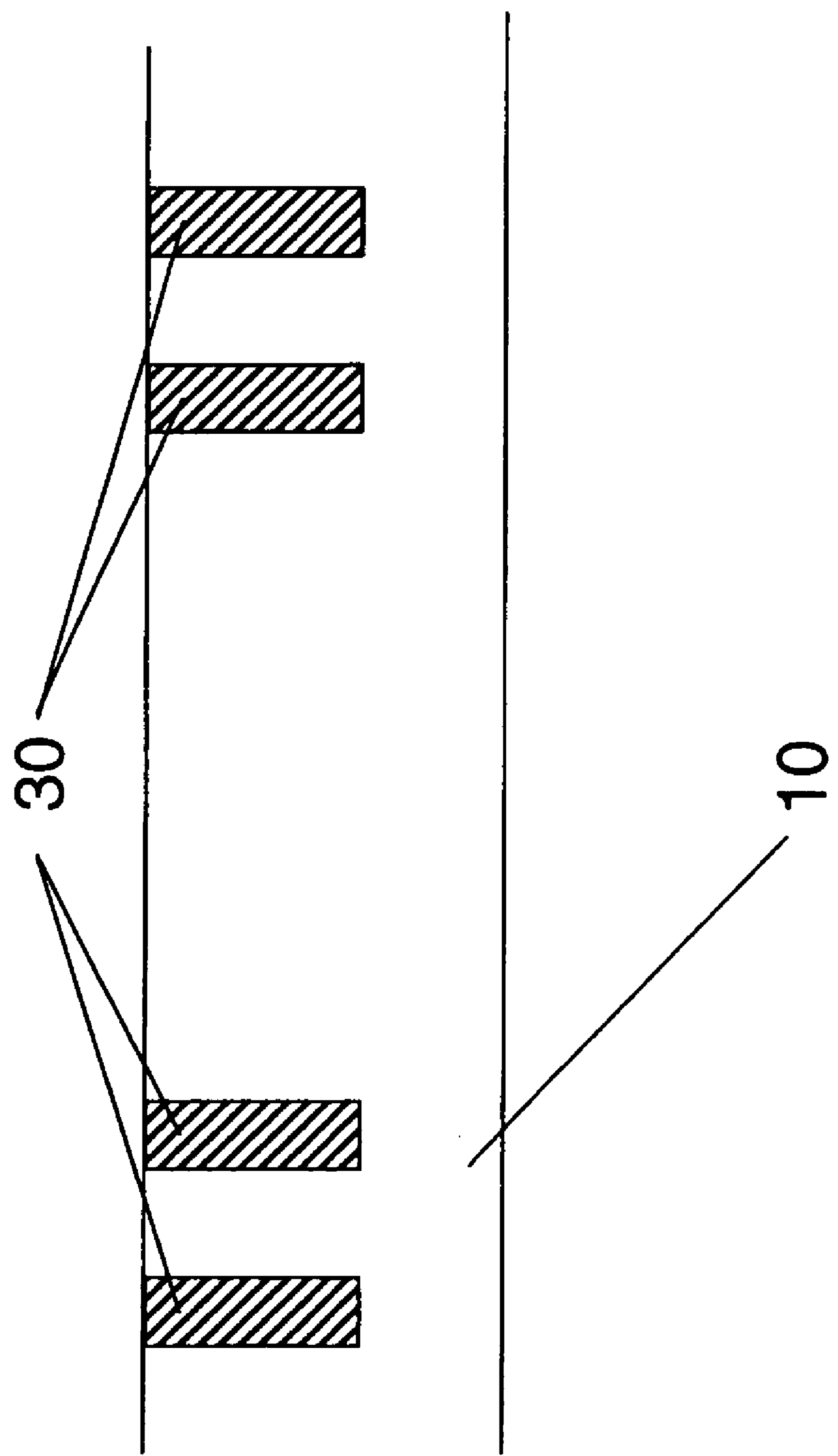

FIG. 2 shows the structure after further processing steps. As shown in FIG. 2, a metal has been deposited in the inner vias 20 and outer vias 60 to form metal vias 30. The wafer surface has also been polished or planarized. In embodiments, the metal may comprise, for example, copper or tungsten. The metal may be deposited, for example, through a conventional deposition process and the wafer surface may be polished or planarized by a conventional process, such as a chemical-mechanical polish (CMP). As such, descriptions of the deposition process and the polishing process are not necessary for a person of ordinary skill in the art to practice this particular step.

Figure 3:
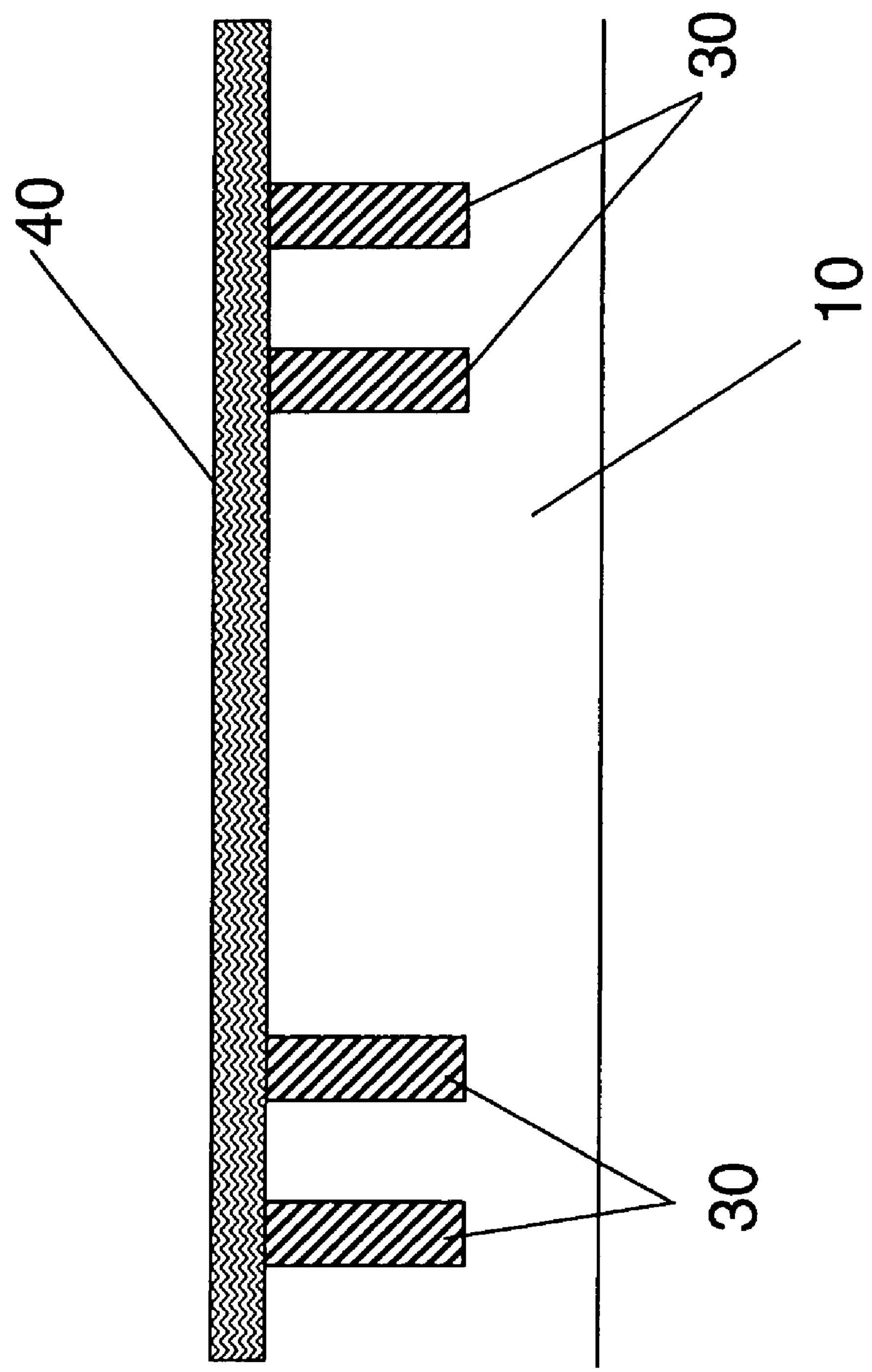

FIG. 3 shows the structure after a further processing step. As shown in FIG. 3, a sacrificial layer 40, e.g., a $Si_3N_4$ cap film, has been deposited on the top of the substrate 10 and over the metal vias 30 formed in the inner vias 20 and outer vias 60. In embodiments, the sacrificial layer 40 may be formed, for example, by a conventional chemical vapor deposition (CVD). As such, a description of the CVD process is not necessary for a person of ordinary skill in the art to practice this particular step.

Figure 4:
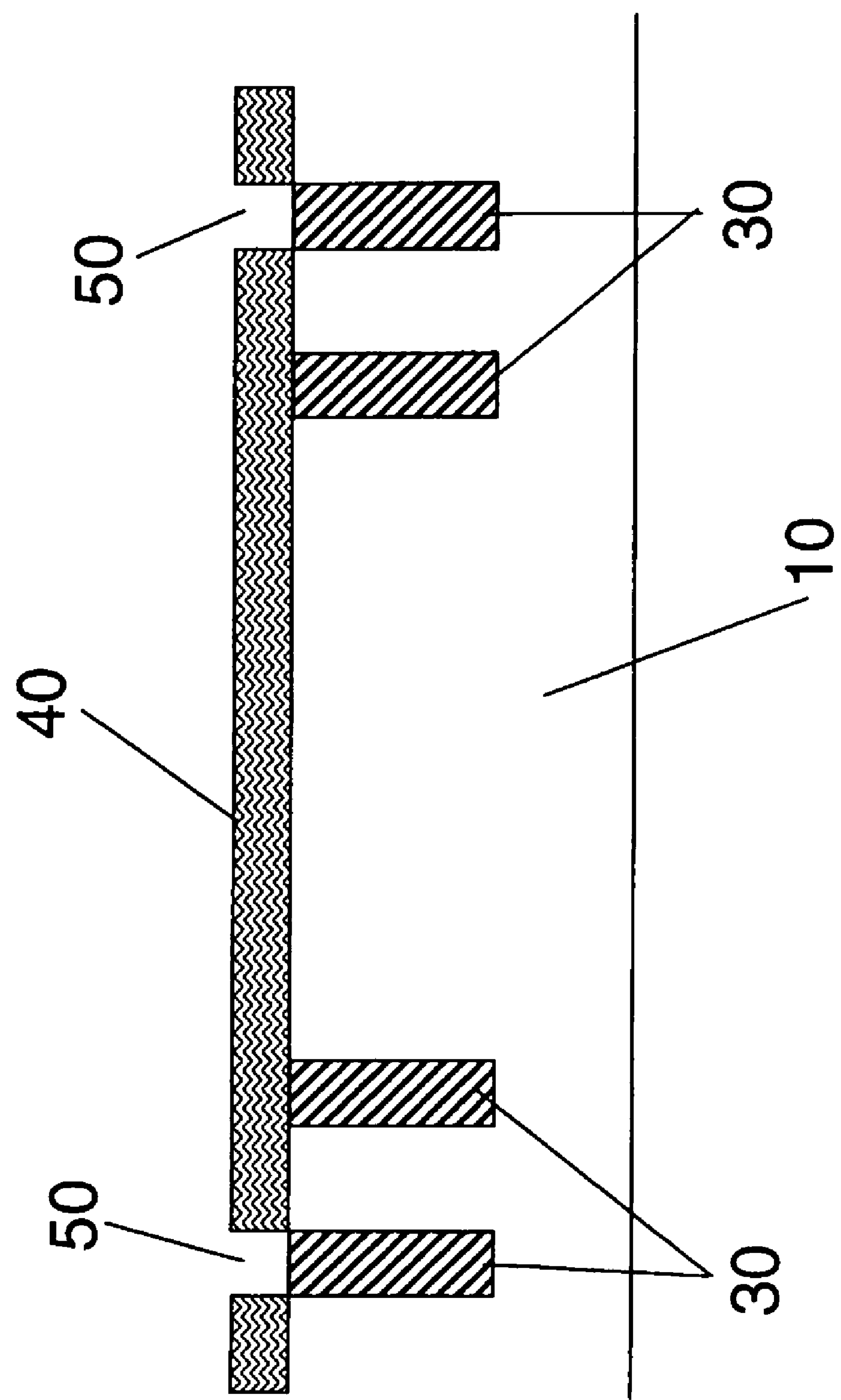

FIG. 4 shows the structure after a further processing step. As shown in FIG. 4, the sacrificial layer 40 has been etched to form openings 50 aligned with the outer vias 60 to expose the metal 30 deposited in the outer vias 60. The sacrificial layer 40 may be etched using lithography and an RIE process, a description of which is not necessary for a person of ordinary skill in the art to practice this particular step.

Figure 5:
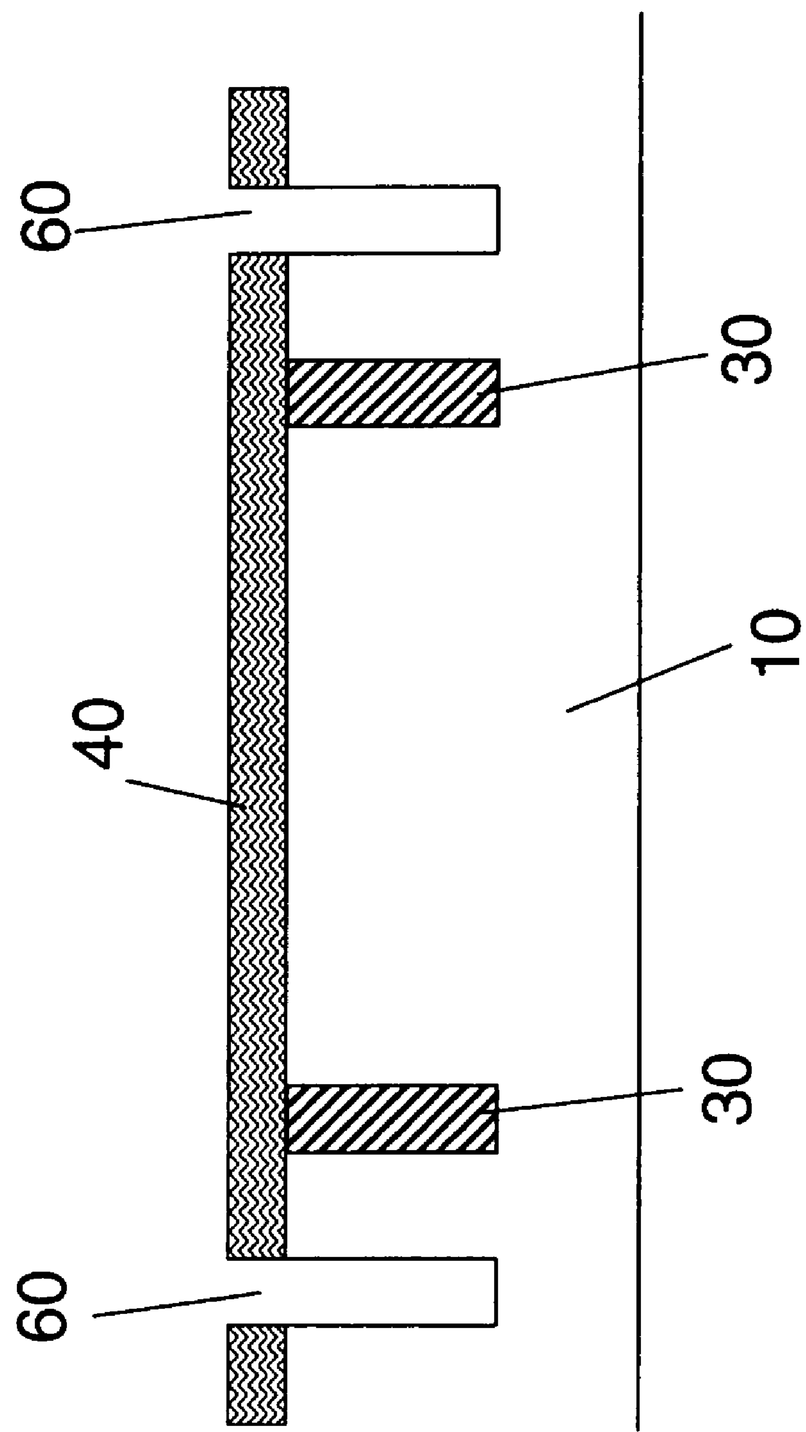

FIG. 5 shows the structure after a further processing step. As shown in FIG. 5, the metal 30 deposited in the outer vias 60 has been removed to re-expose the outer vias 60. In embodiments, the metal may be removed by, for example, a conventional etching with a wet chemical. As such, a description of the wet etch process is not necessary for a person of ordinary skill in the art to practice this particular step.

Figure 6:
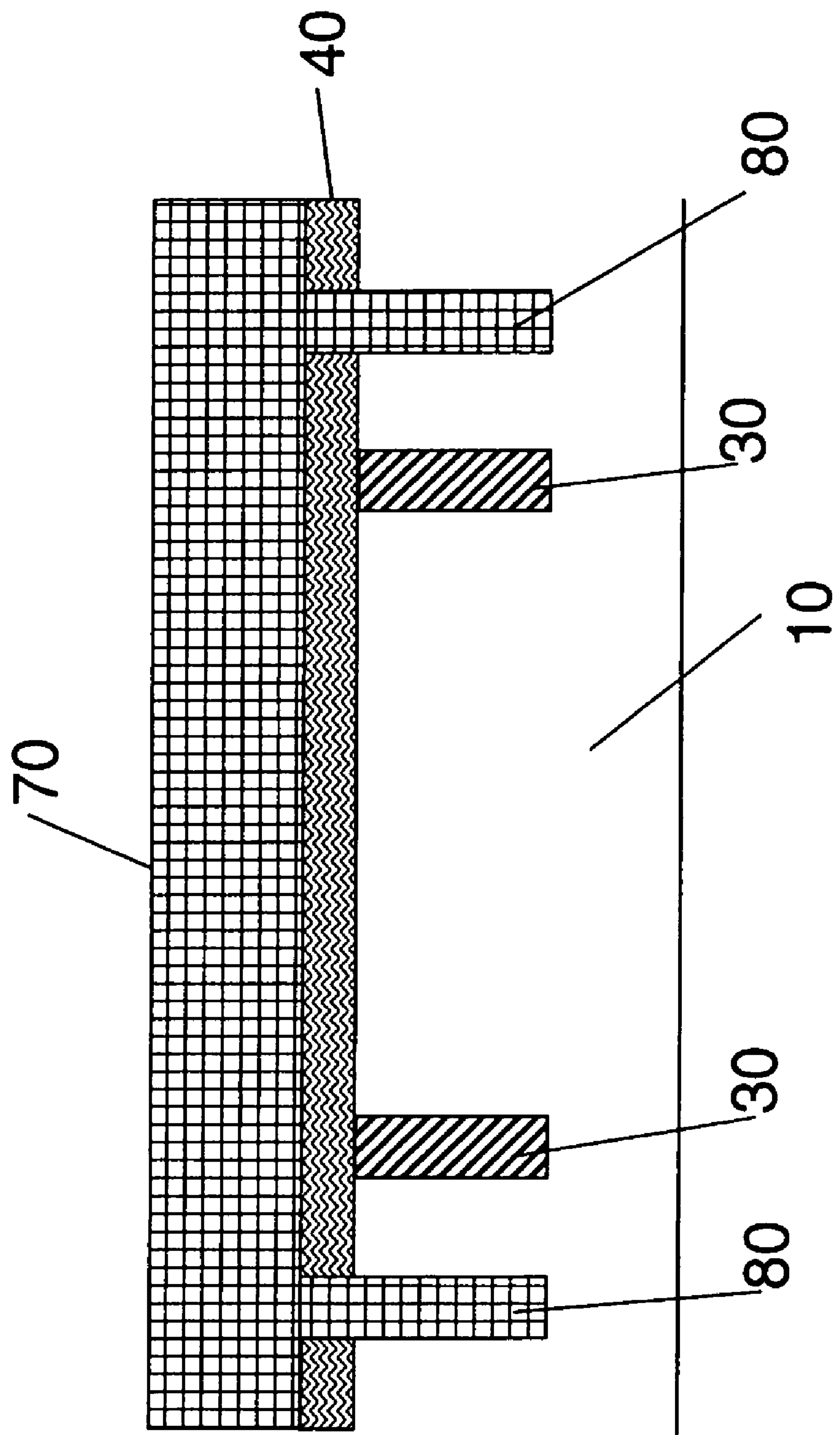

FIG. 6 shows the structure after a further processing step. As shown in FIG. 6, an $SiO_2$ layer 70 may be deposited over the sacrificial layer 40 to fill the outer vias 60 to form $SiO_2$ vias 80. In embodiments, the $SiO_2$ layer 70 may be formed by, for example, a conventional conformal deposit of $SiO_2$. As such, a description of the conformal deposit process is not necessary for a person of ordinary skill in the art to practice this particular step.

Figure 7:
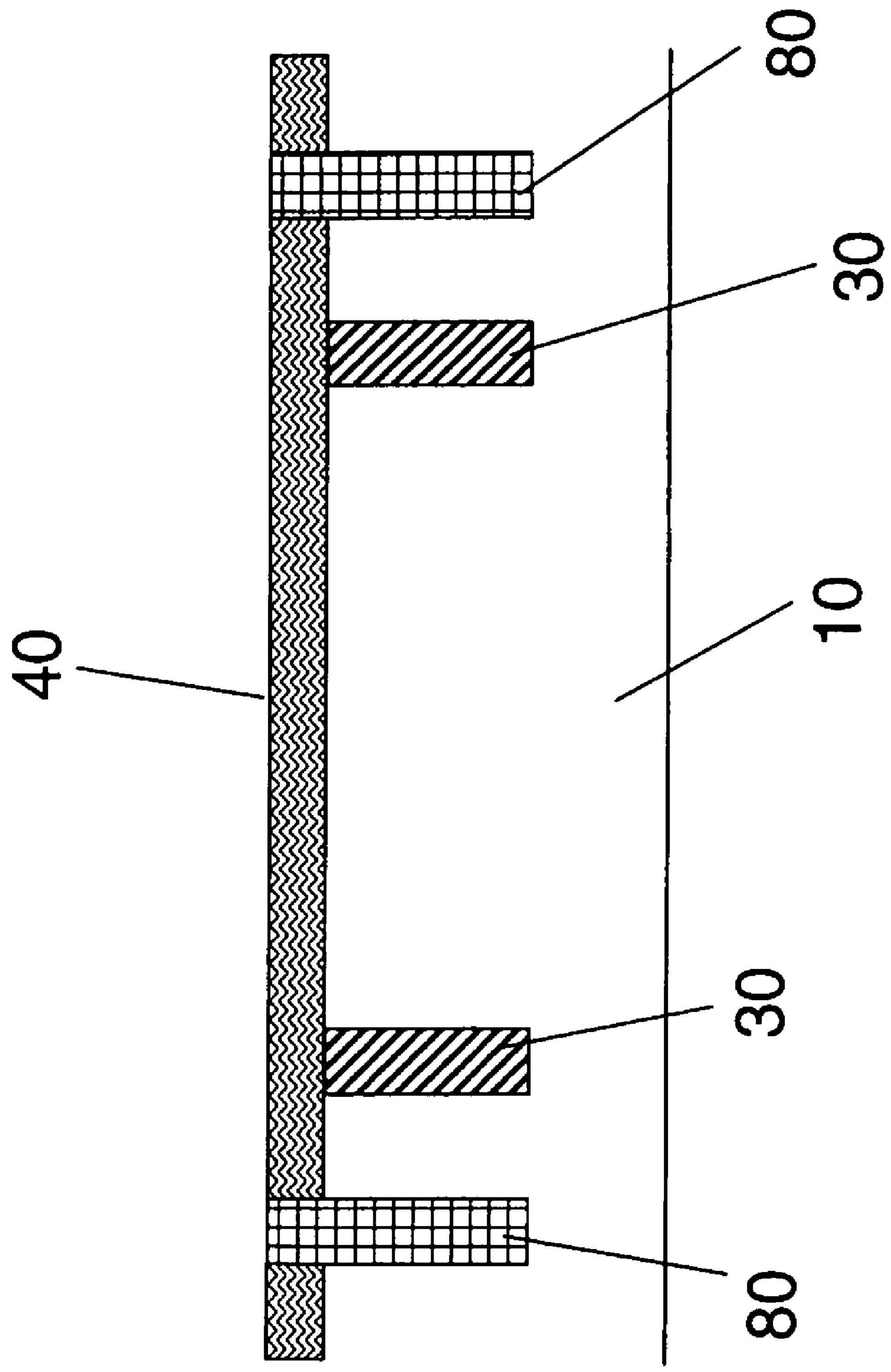

FIG. 7 shows the structure after a further processing step. As shown in FIG. 7, the $SiO_2$ layer 70 may be removed, while leaving the $SiO_2$ vias 80. In embodiments, the $SiO_2$ layer 70 may be removed, for example, by a conventional polishing step. As such, a description of the polishing process is not necessary for a person of ordinary skill in the art to practice this particular step.

While the invention has been described as first depositing a metal in the inner and outer vias 20, 60 to form metal vias 30 followed by a deposition of $SiO_2$ in some of the subsequently re-exposed vias to form $SiO_2$ vias 80, the invention contemplates that the order of the depositions of the metal and the $SiO_2$ may be reversed. That is, the invention contemplates that the $SiO_2$ layer 70 may first be deposited to form the $SiO_2$ vias 80, followed by a metal deposition to form the metal vias 30 (after a removal of $SiO_2$ from some of the $SiO_2$ vias 80 to re-expose those vias).

Furthermore, while the invention has been described as etching the inner and outer vias 20, 60 during the same processing step (see FIG. 1), followed by the formation of the metal vias 30 and $SiO_2$ vias 80, the invention contemplates separate etching steps for the inner and outer vias 20, 60. According to this embodiment, the inner vias 20, for example, may be etched and filled to form the metal vias 30. After a sacrificial layer deposition and etch to form openings, a subsequent etch may form the outer vias 60, which may then be filled with $SiO_2$, to form the $SiO_2$ vias 80.

Figure 8:
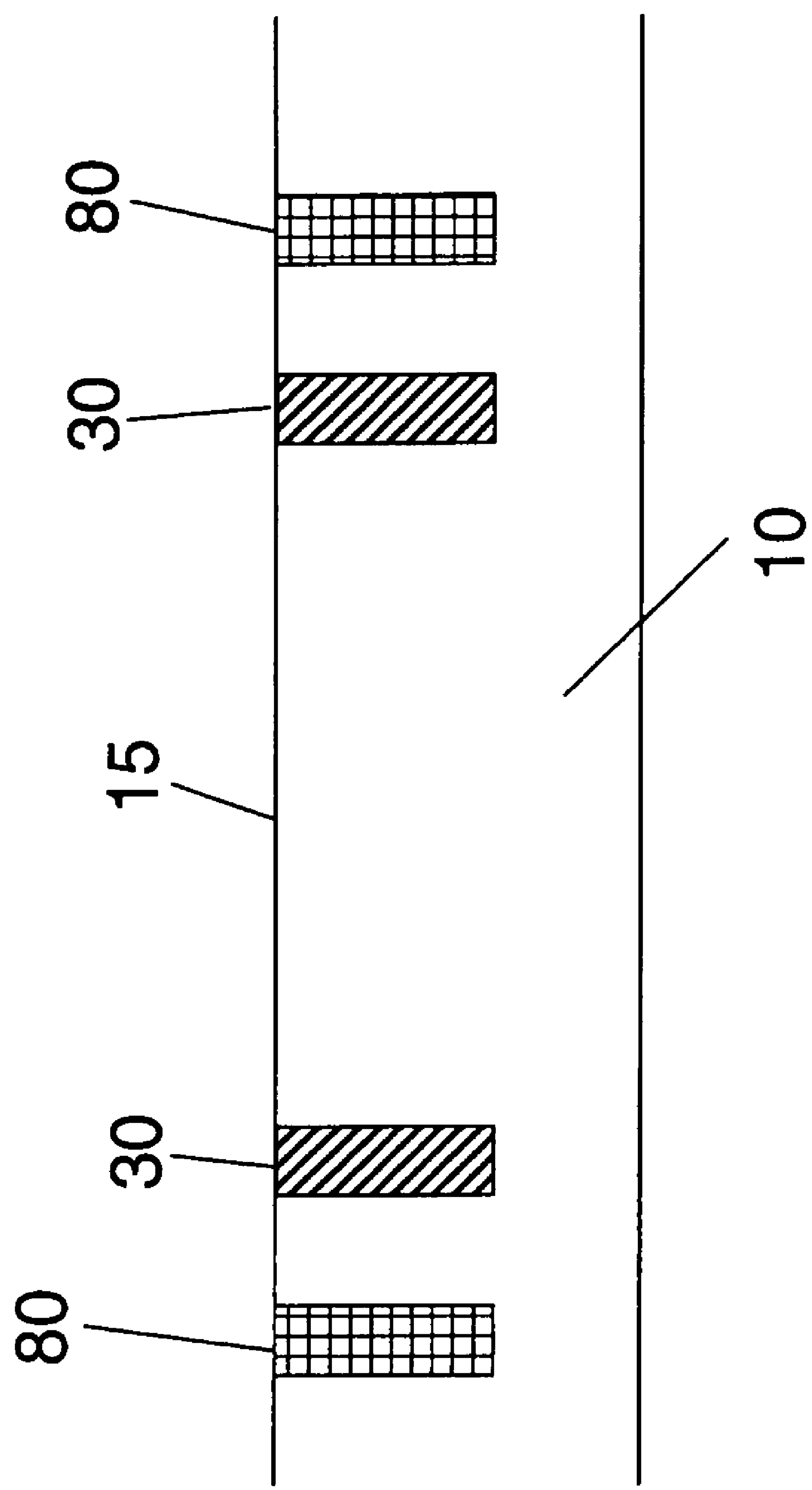

FIG. 8 shows the structure after a further processing step. As shown in FIG. 8, the sacrificial layer 40 may be stripped off and an upper surface of the substrate may be polished by a conventional chemical-mechanical polish or planarization (CMP) process, such that the surface of the $SiO_2$ vias 80 are planar with the top of the substrate 10. As such, a description of the CMP process is not necessary for a person of ordinary skill in the art to practice this particular step.

Figure 9:
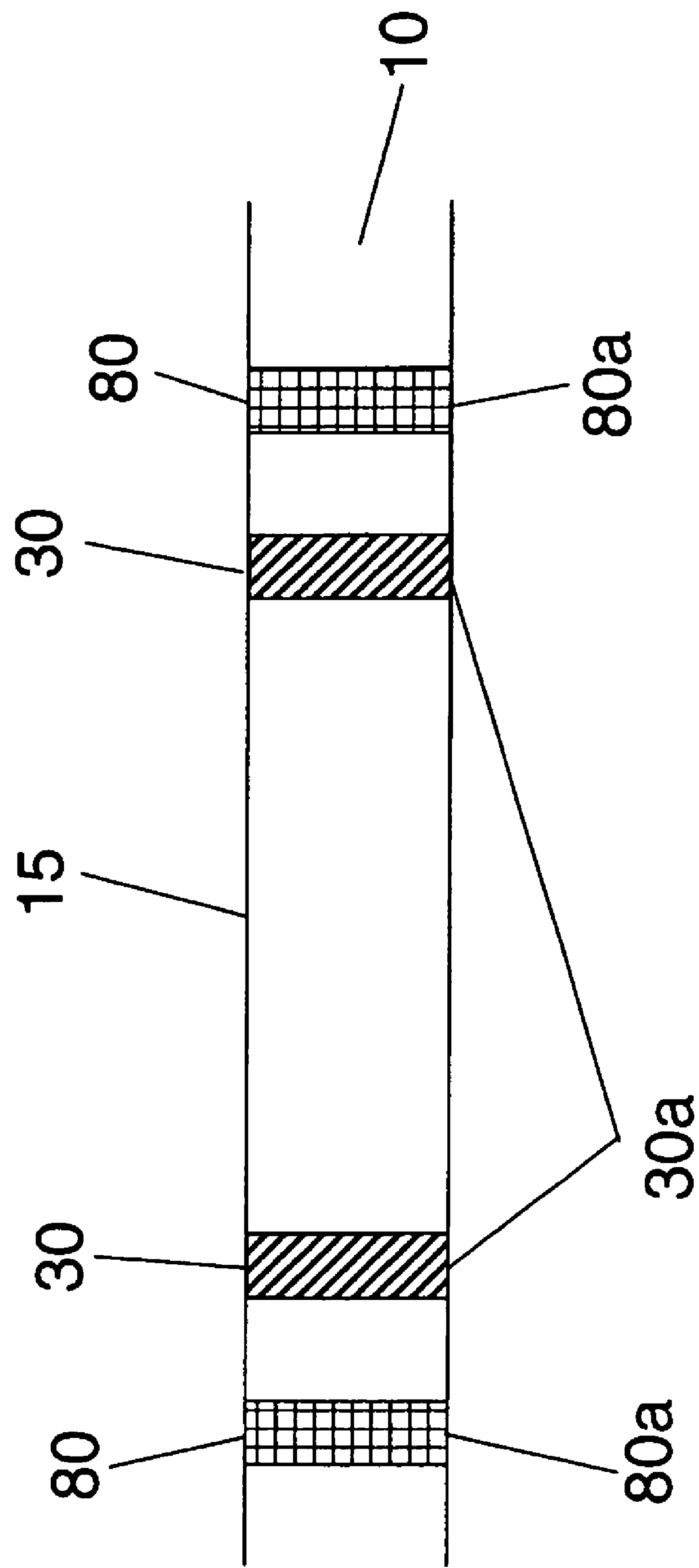

FIG. 9 shows the structure after a further processing step. As shown in FIG. 9, a bottom portion of the substrate 10 may be removed to expose the ends (or a surface) 30*a* of the metal vias 30 and the ends (or a surface) 80*a* of the $SiO_2$ vias 80. By removing the bottom portion of the substrate 10, the metal vias 30 and the $SiO_2$ vias 80 effectively become through-wafer vias (TWVs). In embodiments, the bottom portion of the substrate 10 may be removed through a conventional grinding or polishing process. As such, a description of the grinding process is not necessary for a person of ordinary skill in the art to practice this particular step.

As discussed above, the inner vias 20 and outer vias 60 may be formed as TWVs by etching completely through the substrate 10 when the vias 20, 60 are initially formed (see FIG. 1). However, it may be more cost effective to form the inner and outer vias 20, 60 as shown in FIG. 1, and subsequently remove the bottom portion of the substrate 10 as described above.

Figure 10:
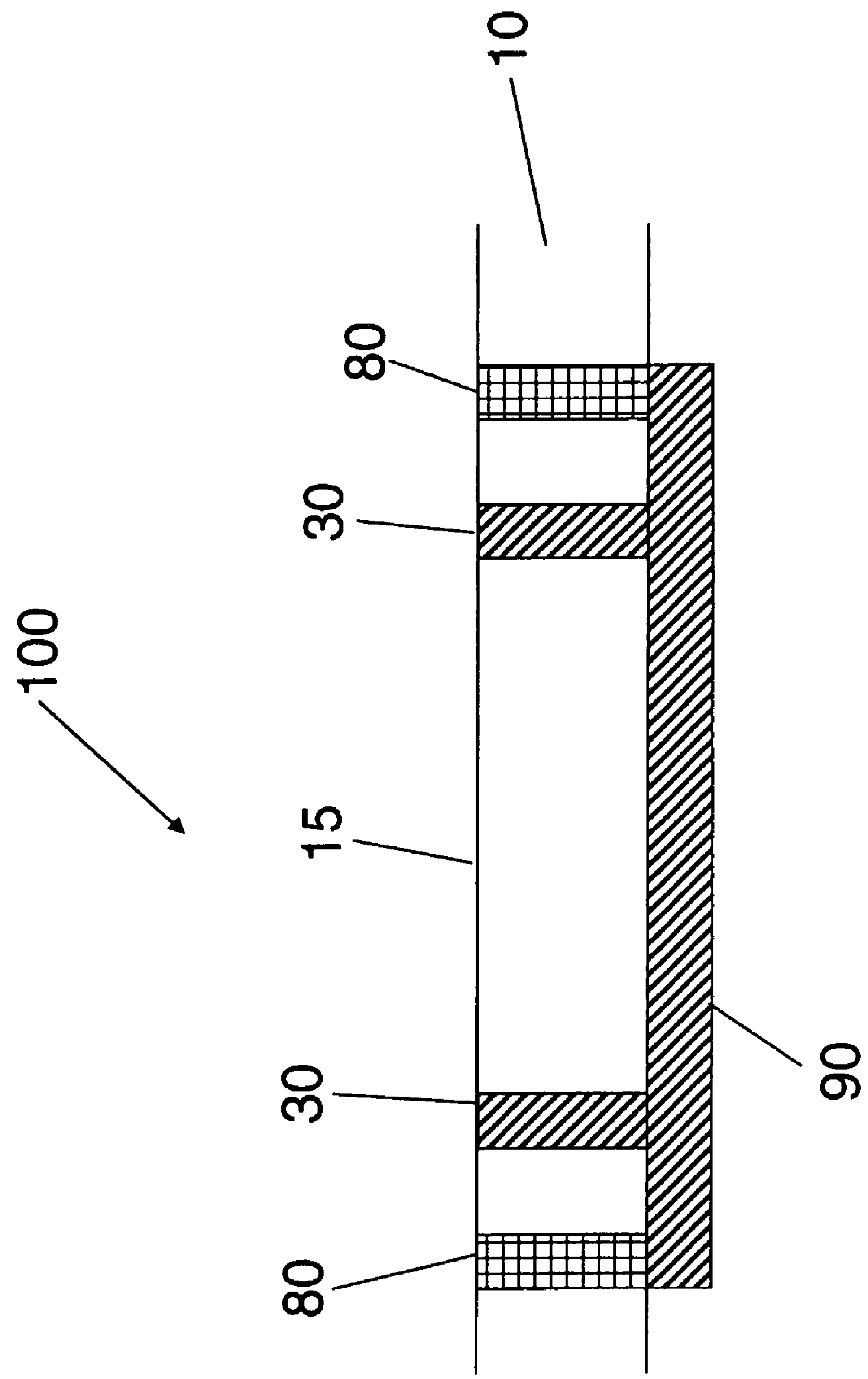
FIG. 10 shows an embodiment of a final structure according to an aspect of the invention.

FIG. 10 shows an embodiment of a final isolation structure 100 after a further processing step according to an aspect of the invention. As shown in FIG. 10, a metal layer 90 may be formed on a surface (e.g., a bottom surface) of the substrate 10 to connect with at least the metal vias 30. In embodiments, the metal layer 90 may extend over the entire bottom of the substrate 10, may extend to the edges of the outermost through-wafer vias ($SiO_2$ vias 80 in the embodiment shown in FIG. 10), or may extend to the metal vias 30. Additionally, while there is usually more space on the bottom surface of the substrate 10 to accommodate the metal layer 90 (e.g., there may be fewer devices or no devices formed on the bottom surface of the substrate 10), in embodiments, the metal layer 90 may be formed on another surface (e.g., an upper surface) of the substrate 10. The combination of the metal layer 90, the metal vias 30 and the $SiO_2$ vias 80 forms an enclosed or substantially enclosed structure. This in turn, creates an isolation region for a device or circuit.

In optional embodiments, the isolation structure may not use the metal layer 90. That is, a structure having metal through-wafer vias 30 and $SiO_2$ through-wafer vias 80 without the metal layer 90 is also contemplated by the invention. Although such a structure may provide less noise isolation than a structure that includes the metal layer 90, it still provides improved noise isolation compared to known structures.

In embodiments, the metal layer 90 may be formed, for example, through a conventional evaporative process or by a deposition process. As such, a description of the evaporative process or the deposition process is not necessary for a person of ordinary skill in the art to practice this particular step. Furthermore, in embodiments, the same metal used to form metal vias 30, e.g., copper or tungsten, may be used to form the metal layer 90. The metal layer 90 may be a few microns in thickness, with other thicknesses contemplated by the invention. Moreover, the structure 100 may be approximately 50-300 microns in thickness, with other thicknesses contemplated by the invention.

By connecting the metal layer 90 with the metal through-wafer vias 30 (in a continuous ring formation) a metal box or ring (formed by the metal through-wafer vias 30 and the metal layer 90) of high conductivity is formed. In embodiments, the metal box is a five-wall metal box; although other configurations are contemplated by the invention. Moreover, in use, the metal box is connected to 0V and provides a low impedance to the substrate noise, while the $SiO_2$ through-wafer via 80 provides a high impedance to the substrate noise. Together, the metal box or ring and the $SiO_2$ through-wafer vias 80 provide an isolation structure 100 having a high insertion loss, which minimizes substrate noise coupling.

Figure 11:
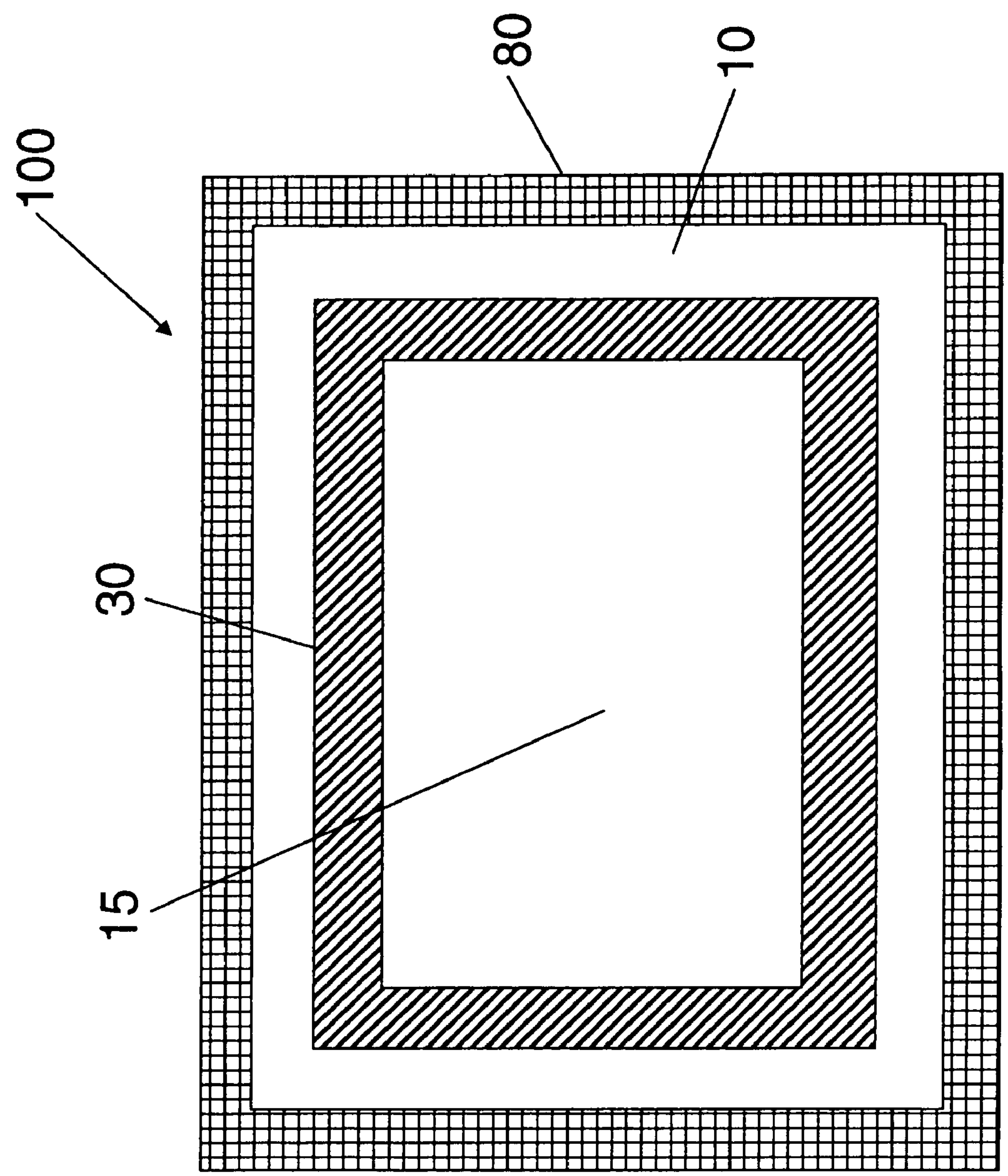
FIGS. 11-15 show top views of alternative embodiments of the invention.

FIG. 11 shows a top view of isolation structure 100 according to an aspect of the invention. As shown in FIG. 11, the structure 100 comprises an outer $SiO_2$ via 80 in a continuous ring formation and an inner metal via 30 in a continuous ring formation formed in the substrate 10. Moreover, the structure 100 has a protected area 15 surrounded by both the $SiO_2$ via 80 and the metal via 30.

Figure 12:
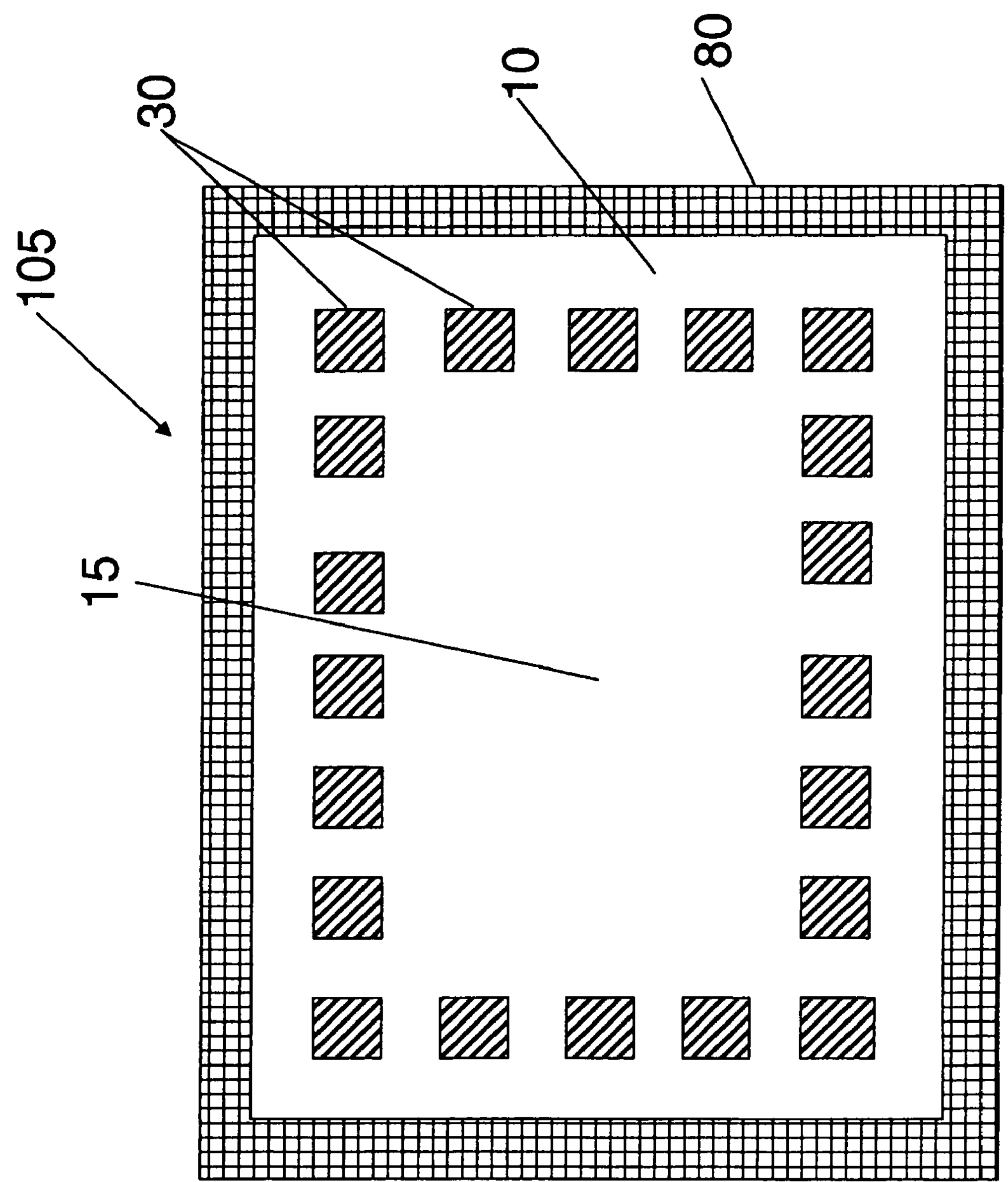

FIG. 12 shows a top view of an isolation structure 105 according to a further aspect of the invention. As shown in FIG. 12, while the outer $SiO_2$ via 80 is formed in the substrate 10 in a continuous ring formation, the metal vias 30 are formed in a segmented ring formation. That is, the metal vias 30 may be formed as a series of discrete vias in a ring formation. In embodiments, it may be preferable for either or both of the metal vias 30 and the $SiO_2$ vias 80 to be formed in a continuous ring formation. However, the vias may be designed based on balancing process versus performance. Therefore, the invention contemplates a range of widths for the discrete vias and other formations based upon design considerations.

Figure 13:
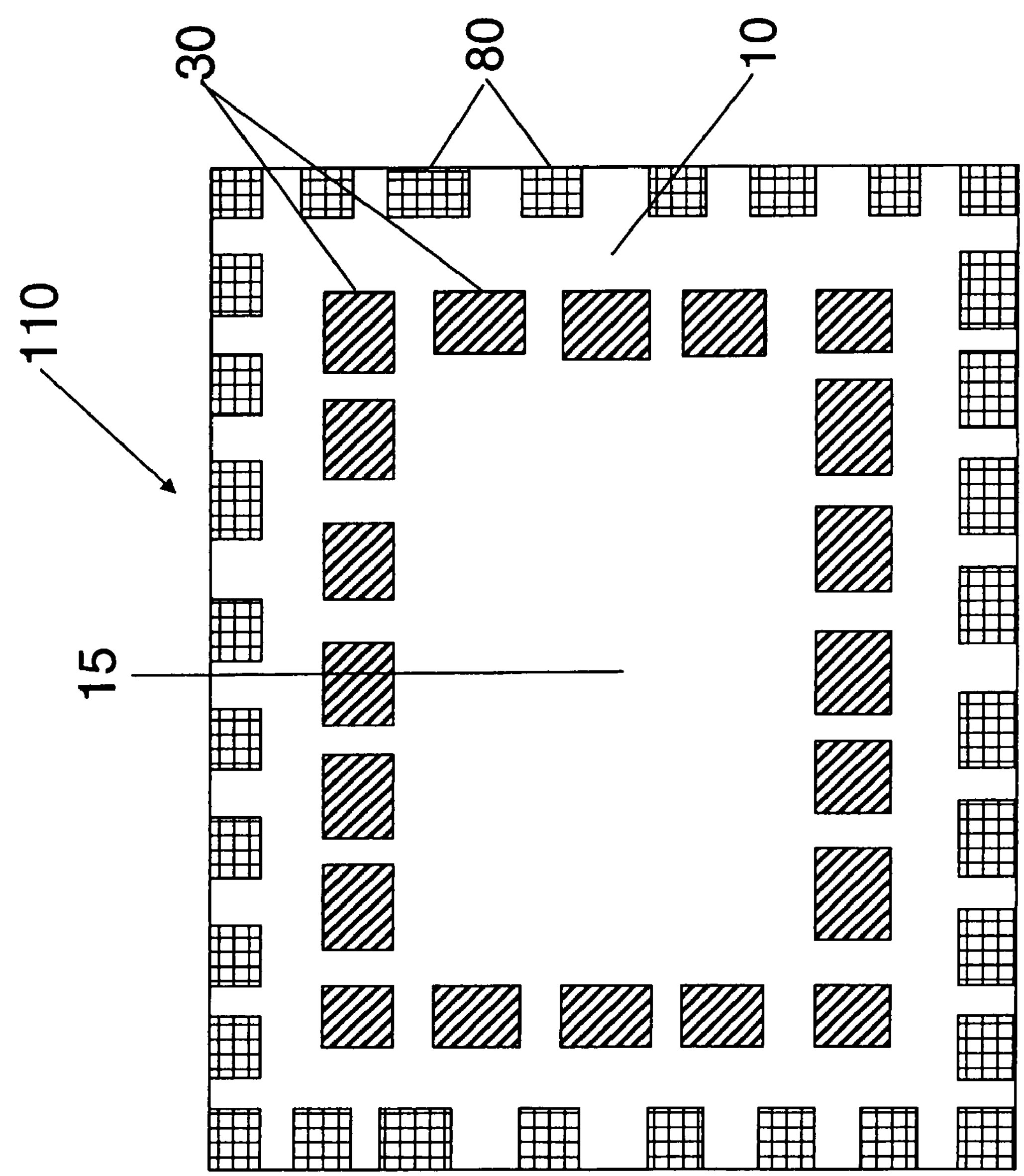

FIG. 13 shows a top view of an isolation structure 110 according to a further aspect of the invention. As shown in FIG. 13, both the inner metal vias 30 and the outer $SiO_2$ vias 80 may be formed in a segmented ring formation. Moreover, the inner metal vias 30 and the outer $SiO_2$ vias 80 may be arranged in an offset manner relative to one another, such that there is no direct path from an outside of the outer vias ($SiO_2$ vias in this embodiment) to the protected (or isolation) area 15. This arrangement provides an effective enclosure about the protected area 15.

Figure 14:
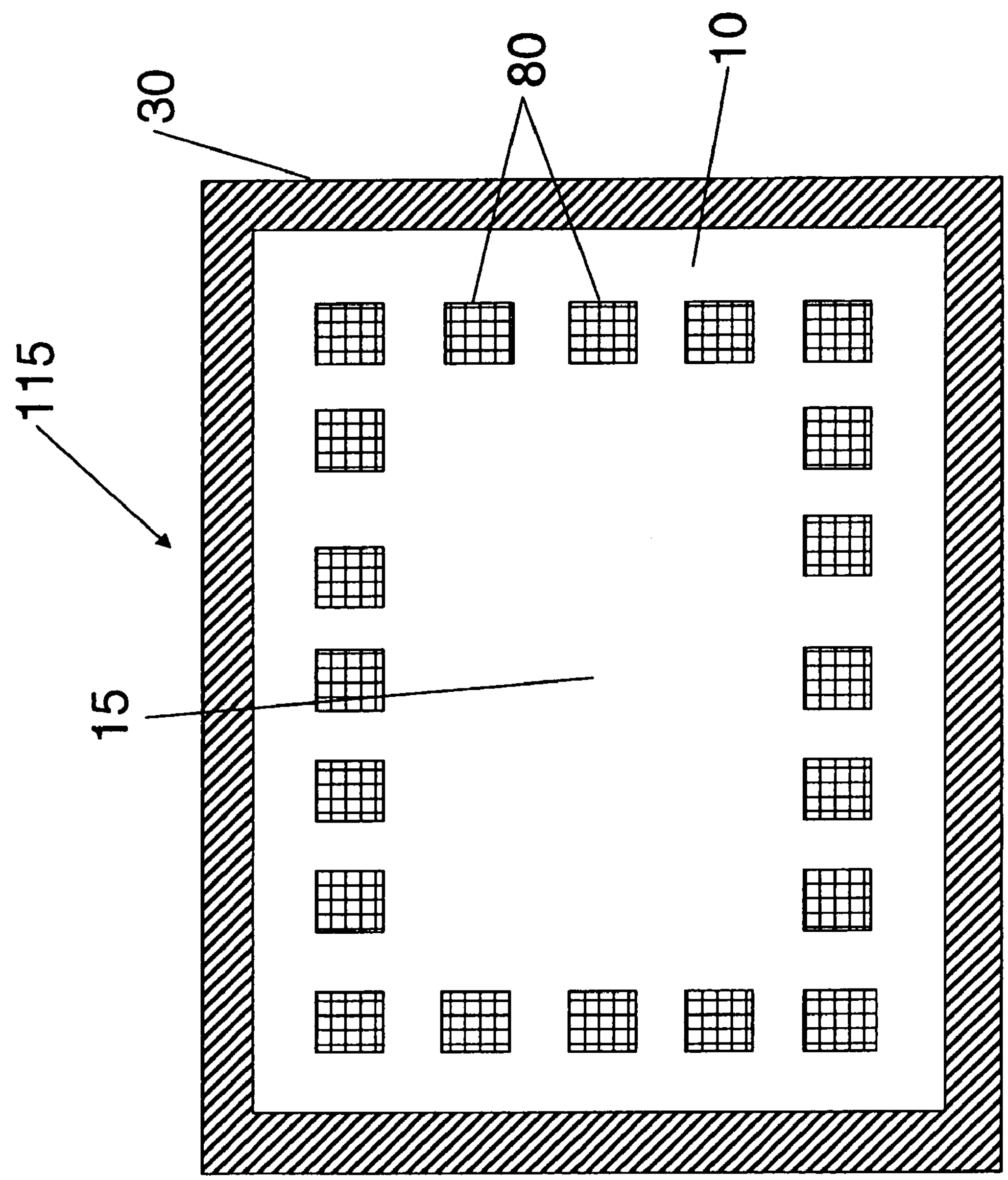

FIG. 14 shows a top view of an isolation structure 115 according to a further aspect of the invention. As shown in FIG. 14, the metal via 30 and the $SiO_2$ vias 80 have been reversed as compared to FIG. 12. That is, the $SiO_2$ vias 80 are formed as the inner vias and the metal via 30 is formed as the outer via in the substrate 10. Moreover, the $SiO_2$ vias 80 are formed in a segmented ring formation, while the metal via 30 is formed in a continuous ring formation.

Figure 15:
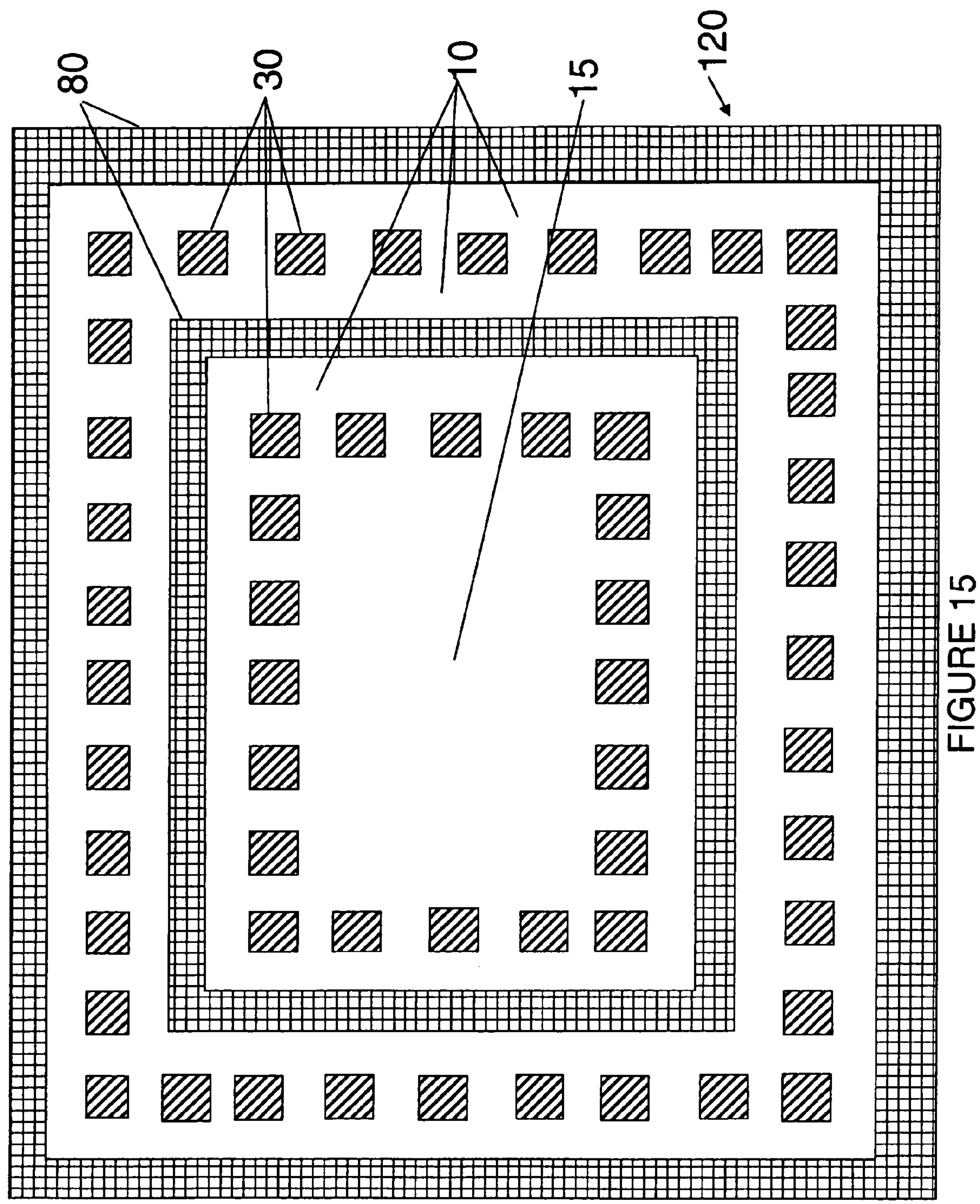

FIG. 15 shows a top view of an isolation structure 120 according to a further aspect of the invention. As shown in FIG. 15, the structure 120 may comprise multiple turns, or multiple $SiO_2$ through-wafer vias 80 in ring formations and/or multiple metal through-wafer vias 30 in ring formations. By providing multiple turns, or multiple $SiO_2$ through-wafer vias 80 and/or multiple metal through-wafer vias 30, further noise isolation may be achieved. Moreover, as shown in FIG. 15, the metal vias 30 are formed in a segmented ring formation.

However, it should be understood that the $SiO_2$ vias 80 and metal vias 30 need not be arranged in an alternating pairs. That is, in embodiments, the structure may be formed of two metal vias 30 in ring formations with a single $SiO_2$ via 80 in a ring formation formed therebetween. Alternatively, in embodiments, two metal vias 30 in ring formations may be formed with a single $SiO_2$ via 80 in a ring formation formed inside or outside of the two metal vias 30. Moreover, in embodiments, the structure may be formed of two $SiO_2$ vias 80 in ring formations with a single metal via 30 in a ring formation formed therebetween. Alternatively, in embodiments, two $SiO_2$ vias 80 in ring formations may be formed with a single metal via 30 in a ring formation formed inside or outside of the two $SiO_2$ vias 80. Additionally, the invention contemplates that any of the vias may be formed in a continuous or segmented ring formation. Thus, the invention contemplates different orientations of the two types of through-wafer via formations.

Performance Analysis

Figure 16:
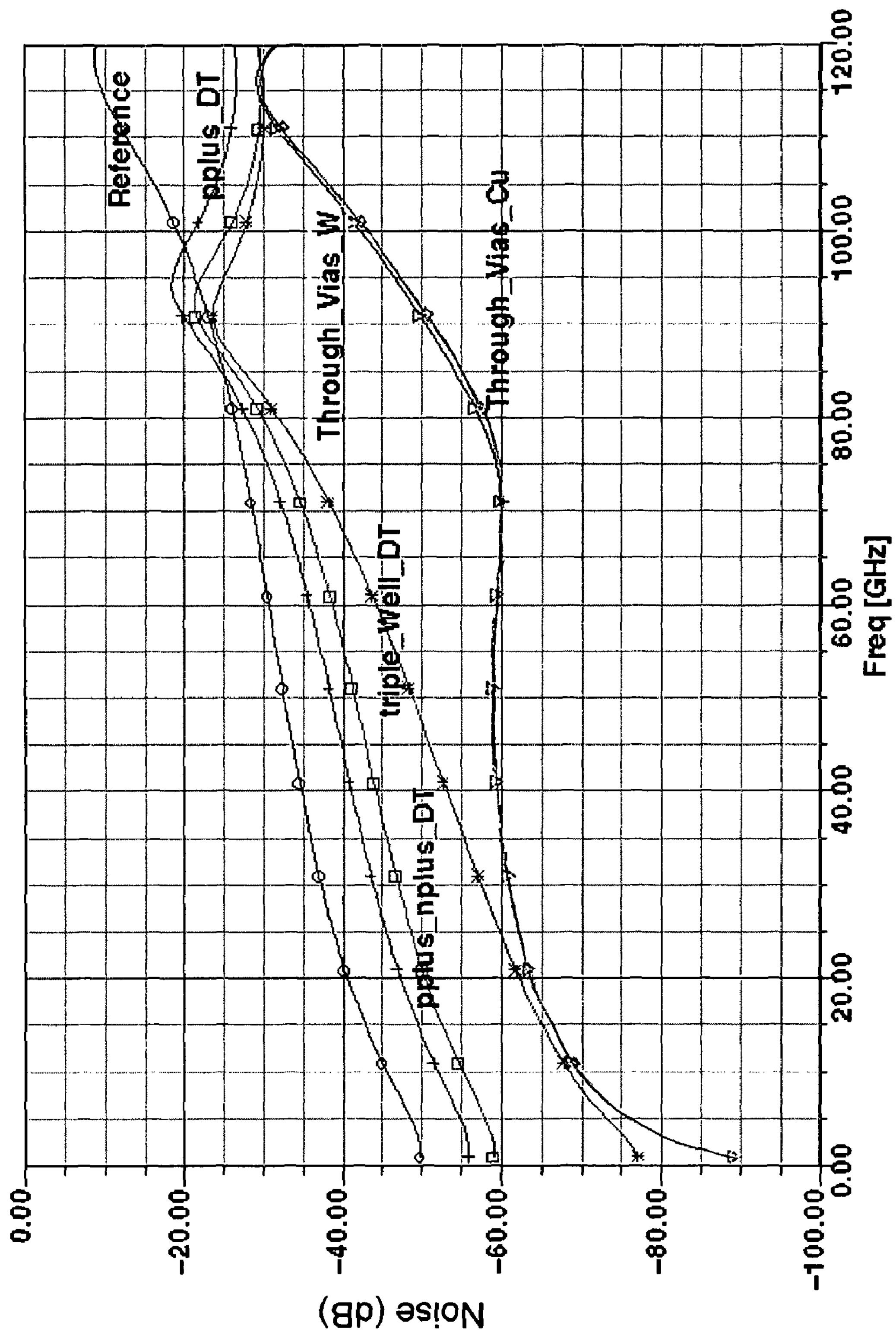
FIG. 16 shows a simulation result graph of substrate noise versus frequency comparing the present invention with known devices.

FIG. 16 shows a simulation result graph of substrate noise over a range of frequencies comparing noise isolation provided by the present invention with noise isolation provided by known structures. As shown in FIG. 16, a known structure having a P+ guard ring and a deep trench improves the noise isolation by about 5 dB as compared to a reference structure having no noise isolation structure. Additionally, a known structure having P+ and N+ guard rings and a deep trench improves the noise isolation by about 9 dB as compared to the reference structure. Furthermore, a known structure having a triple well structure and a deep trench ring improves the noise isolation by about 10-15 dB as compared to the reference structure.

In contrast, as shown in FIG. 16, the present invention improves the noise isolation by approximately 20-30 dB as compared to the reference structure. Moreover, as shown in FIG. 16, the present invention provides much better noise isolation improvement from frequencies of 30 GHz to slightly above 100 GHz than any of known structures. Additionally, as shown in FIG. 16, there may be similar achieved noise isolation for a structure having a metal through-wafer vias 30 and metal layer 90 formed of tungsten, as compared to copper.

Design Flow

Figure 17:
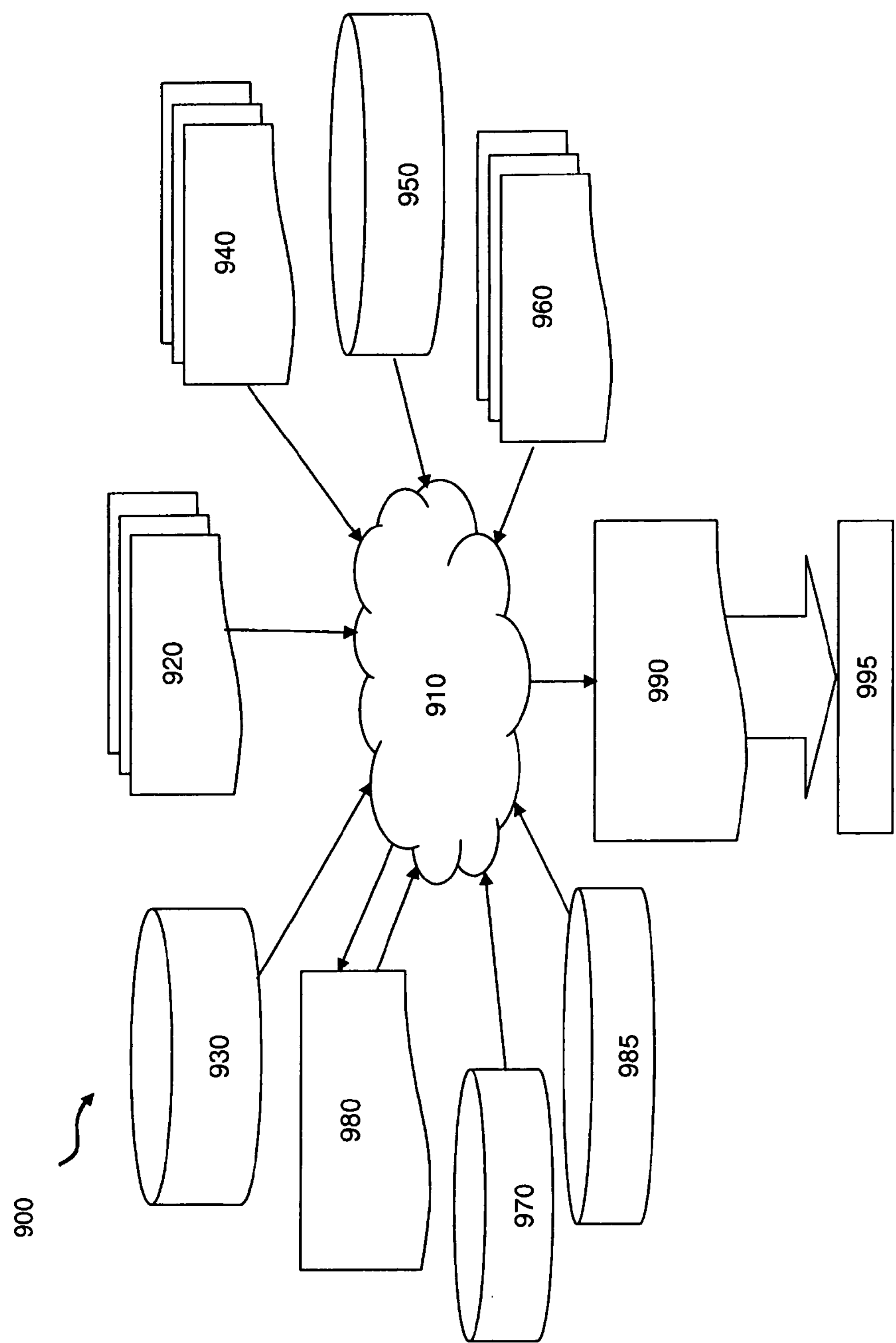
FIG. 17 is a flow diagram of a design process used in semiconductor design, manufacturing, and/or testing.

FIG. 17 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company, or may be generated by the operator of the design flow, or from other sources. Design structure 920 comprises, e.g., circuit structure 100 in the form of schematics or HDL, a hardware-description language (e.g., VERILOG®, Very High Speed Integrated Circuit (VHSIC) Hardware Description Language (VHDL), C, etc.). VERILOG is a registered trademark of Cadence Design Systems, Inc. in the United States, other countries, or both. Design structure 920 may be contained on one or more machine readable medium. For example, design structure 920 may be a text file or a graphical representation of circuit structure 100. Design process 910 preferably synthesizes (or translates) circuit structure 100 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for, e.g., the circuit structure 100.

Design process 910 may include using a variety of inputs. For example, the inputs may include inputs from library elements 930, which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, amongst other inputs. One of ordinary skill in the art of integrated circuit design can appreciate the extent of possible electronic design automation tools and applications used in design process 910 without deviating from the scope and spirit of the invention. The design structure of the invention is not limited to any specific design flow.

Ultimately, design process 910 preferably translates, e.g., circuit structure 100, along with the rest of the integrated circuit design (if applicable), into a final design structure 990 (e.g., information stored in a graphical data system (GDS) storage medium). Final design structure 990 may comprise information such as, for example, test data files, design content files, manufacturing data, layout parameters, wires, levels of metal, vias, shapes, test data, data for routing through the manufacturing line, and any other data required by a semiconductor manufacturer to produce, e.g., circuit structure 100. Final design structure 990 may then proceed to a stage 995 where, for example, final design structure 990 proceeds to tape-out, is released to manufacturing, is sent to another design house or is sent back to the customer.

While the invention has been described in terms of embodiments, those of skill in the art will recognize that the invention can be practiced with modifications and in the spirit and scope of the appended claims.

What is claimed is:

1. A method comprising:

forming at least one via filled with a dielectric and at least one via filled with metal in a first surface of a substrate;

removing a second surface portion of the substrate opposite the first surface of the substrate to expose at least a surface of the metal; and forming a metal layer in contact with at least the exposed surface of the metal to provide an electrical noise isolation area on the substrate.

2. The method of claim 1, wherein the dielectric and the metal substantially surround the electrical noise isolation area.

3. The method of claim 1, wherein:

the metal and the metal layer comprise one of copper and tungsten; and the dielectric comprises $SiO_2$.

4. The method of claim 1, wherein the at least one via filled with the dielectric and the at least one via filled with metal are each formed as one of continuous and segmented ring structures.

5. The method of claim 1, wherein the at least one via filled with metal is formed between the isolation area and the at least one via filled with the dielectric.

6. The method of claim 1, wherein the isolation area provides a region of low substrate noise coupling.

7. The method of claim 1, wherein the at least one via filled with the dielectric and the at least one via filled with the metal are formed to be spaced from one another at least a minimum distance.

8. The method of claim 7, wherein:

the removing of the second surface portion is after the forming of the at least one via filled with the dielectric and the at least one via filled with metal; and the forming of the metal layer is after the removing of the second surface portion.

9. The method of claim 8, wherein:

the first surface of the substrate is a top surface of the substrate;

the second surface portion of the substrate is a bottom surface portion of the substrate; and the surface of the metal is a bottom surface of the metal.

10. The method of claim 9, wherein:

the removing of the second surface portion exposes a bottom surface of the dielectric; and the forming the metal layer comprises forming the metal layer in contact with the bottom surface of the dielectric.

11. A method comprising:

forming at least one via extending partially in a substrate and filled with a metal comprising one of copper and tungsten;

forming at least one via extending partially in the substrate and filled with a dielectric comprising $SiO_2$, an upper surface of the metal and the dielectric being exposed;

removing a portion of the substrate to expose the metal and the dielectric at an end opposing the exposed surface of the metal and the dielectric; and forming a metal layer in contact with a surface of the substrate to contact the exposed end of the metal and the dielectric to provide an electrical noise isolation area on the substrate.

12. The method of claim 11, wherein the at least one via filled with metal is formed between the isolation area and the at least one via filled with the dielectric.

13. The method of claim 12, wherein the at least one via filled with the dielectric and the at least one via filled with metal are each formed as one of continuous and segmented ring structures.

* * * * *